US012813345B2

(12) United States Patent
Zhang et al.

(10) Patent No.: US 12,813,345 B2
(45) Date of Patent: Nov. 24, 2026

(54) WAFER-LEVEL FABRICATION OF ELECTROSTATIC DISCHARGE DEVICES

(71) Applicant: TEXAS INSTRUMENTS INCORPORATED, Dallas, TX (US)

(72) Inventors: Rongwei Zhang, Plano, TX (US); Thomas Kronenberg, Dallas, TX (US); Jie Chen, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 496 days.

(21) Appl. No.: 18/459,075

(22) Filed: Aug. 31, 2023

(65) Prior Publication Data

US 2025/0079401 A1 Mar. 6, 2025

(51) Int. Cl.

| | |
|---|---|
| ***H10W 90/00*** | (2026.01) |
| ***H10D 84/03*** | (2025.01) |
| ***H10P 50/24*** | (2026.01) |
| ***H10W 42/60*** | (2026.01) |
| ***H10W 72/00*** | (2026.01) |
| ***H10W 74/01*** | (2026.01) |
| ***H10W 74/10*** | (2026.01) |

(52) U.S. Cl.

CPC .......... *H10W 90/00* (2026.01); *H10D 84/038* (2025.01); *H10P 50/242* (2026.01); *H10W 42/60* (2026.01); *H10W 74/016* (2026.01); *H10W 74/137* (2026.01); *H10W 72/01335* (2026.01); *H10W 72/01338* (2026.01); *H10W 72/0198* (2026.01); *H10W 90/733* (2026.01)

(58) Field of Classification Search

CPC . H10W 42/60; H10W 74/014; H10W 74/016; H10W 74/111; H10W 74/137; H10W 76/138; H10W 72/01335; H10W 72/01338; H10W 72/0198; H10W 90/733; H10W 72/944; H10W 72/952; H10W 74/114; H10W 74/473; H10W 80/312; H10W 80/334; H10W 90/26; H10W 90/297; H10W 90/722; H10W 90/724; H10W 90/726; H10W 90/732; H10W 90/736; H10W 90/752; H10W 90/754; H10W 90/756; H10W 90/792; H10D 84/038; H10D 1/20; H10D 1/692; H10P 50/242; H10F 55/255; H10F 30/225

See application file for complete search history.

(56) References Cited

U.S. PATENT DOCUMENTS

| | | | | |
|---|---|---|---|---|
| 9,455,539 | B1 * | 9/2016 | Axelowitz ............ | H10W 70/09 |
| 2009/0243045 | A1 * | 10/2009 | Pagaila ................... | H10P 72/74 257/E21.268 |

(Continued)

*Primary Examiner* — Mouloucoulaye Inoussa

(74) *Attorney, Agent, or Firm* — Dawn Jos; Charles F. Koch

(57) ABSTRACT

In examples, a package comprises first and second dies including first and second diodes, respectively. The package comprises first and second metal contacts coupled to bottom surfaces of the first and second dies, respectively, with the first and second metal contacts exposed to a bottom surface of the package. The package also comprises an isolation layer between the first and second dies and between the first and second metal contacts and a metal layer coupled to top surfaces of the first and second dies. The package also comprises a mold compound covering the first and second dies and the metal layer.

19 Claims, 16 Drawing Sheets

(56) References Cited

U.S. PATENT DOCUMENTS

| | | | | |
|---|---|---|---|---|
| 2012/0056312 | A1* | 3/2012 | Pagaila | H10W 20/20<br>257/E23.116 |
| 2012/0217644 | A1* | 8/2012 | Pagaila | H10W 20/20<br>257/E21.705 |
| 2015/0037914 | A1* | 2/2015 | Takahashi | H10P 74/207<br>438/15 |
| 2017/0250172 | A1* | 8/2017 | Huang | H10W 90/00 |
| 2022/0406956 | A1* | 12/2022 | Sankaran | H10D 1/20 |

* cited by examiner

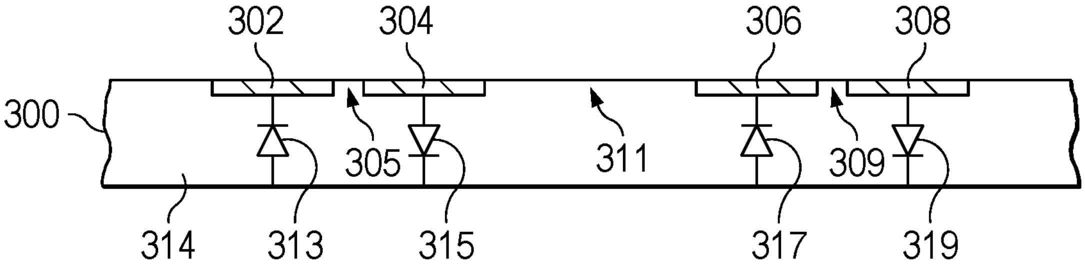
FIG. 3A1
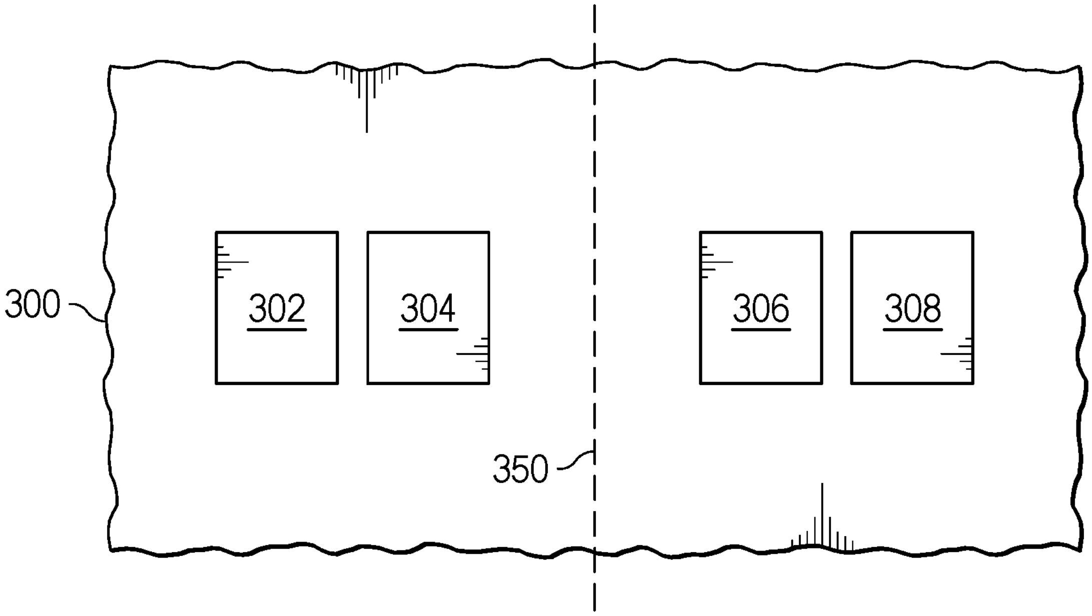
FIG. 3A2

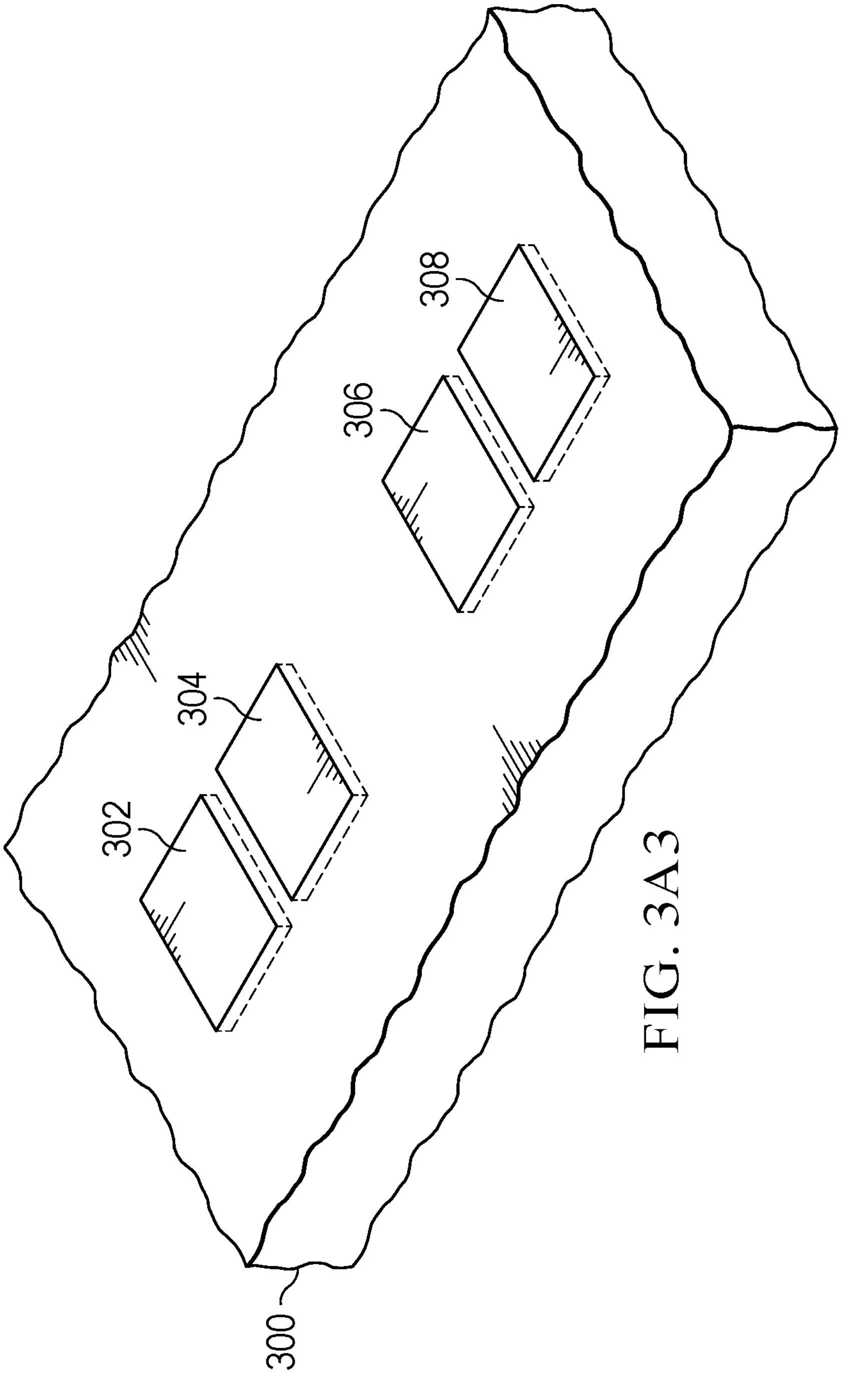
FIG. 3A3

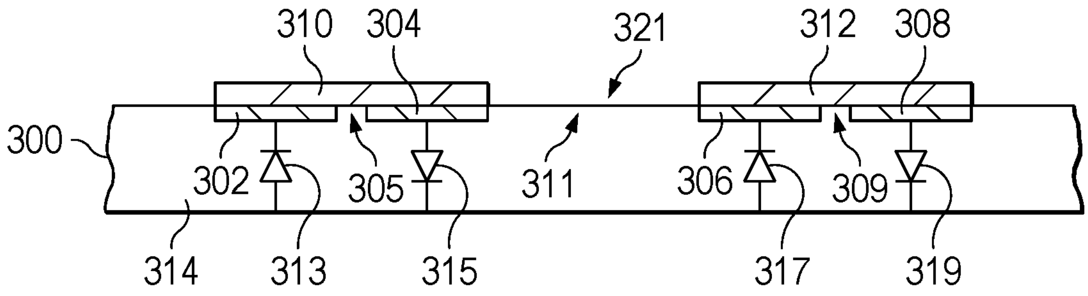
FIG. 3B1
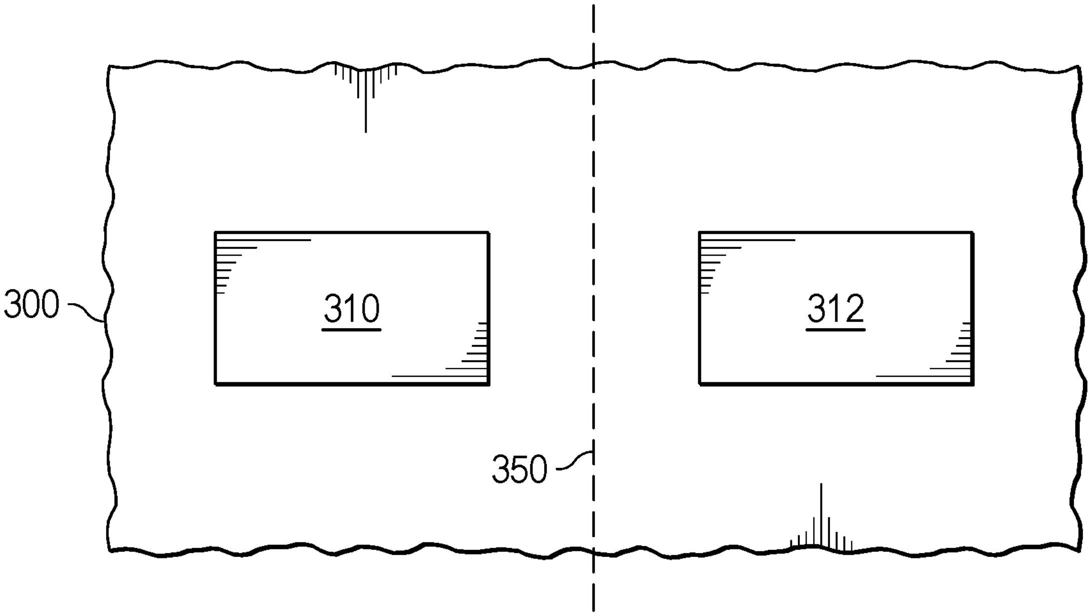
FIG. 3B2

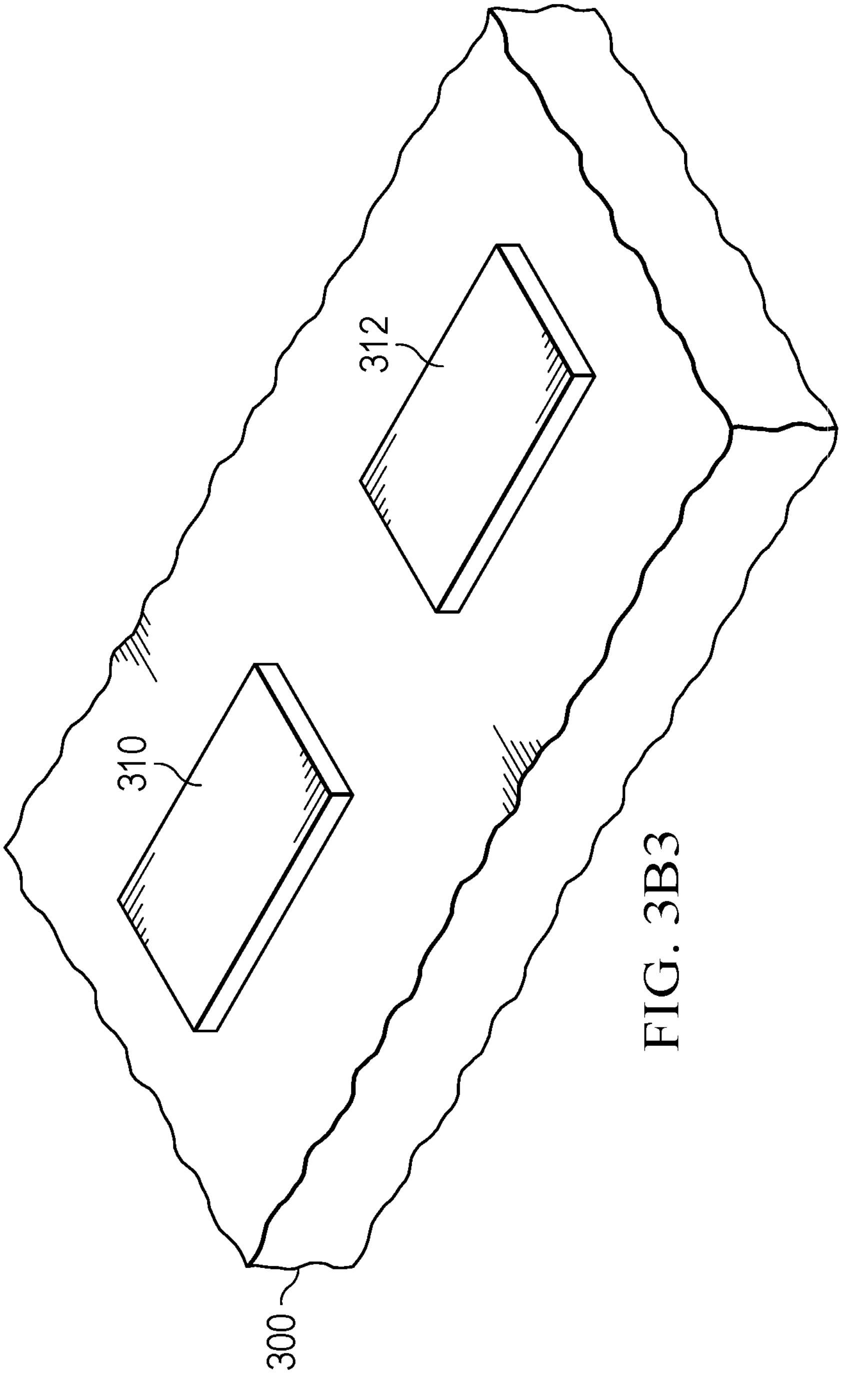
FIG. 3B3

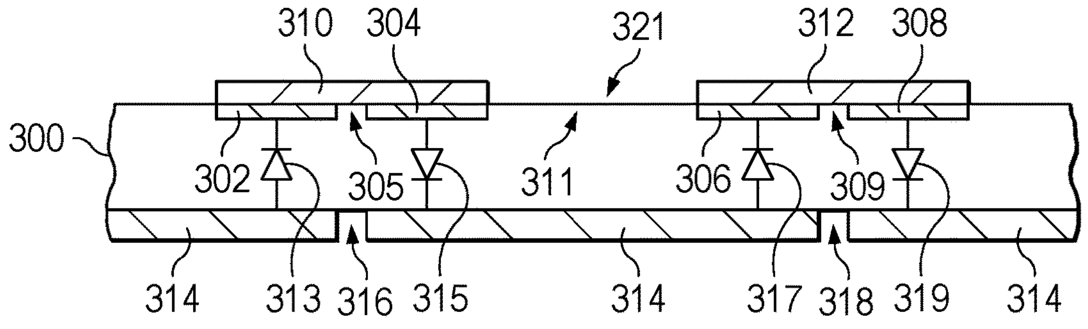
FIG. 3C1
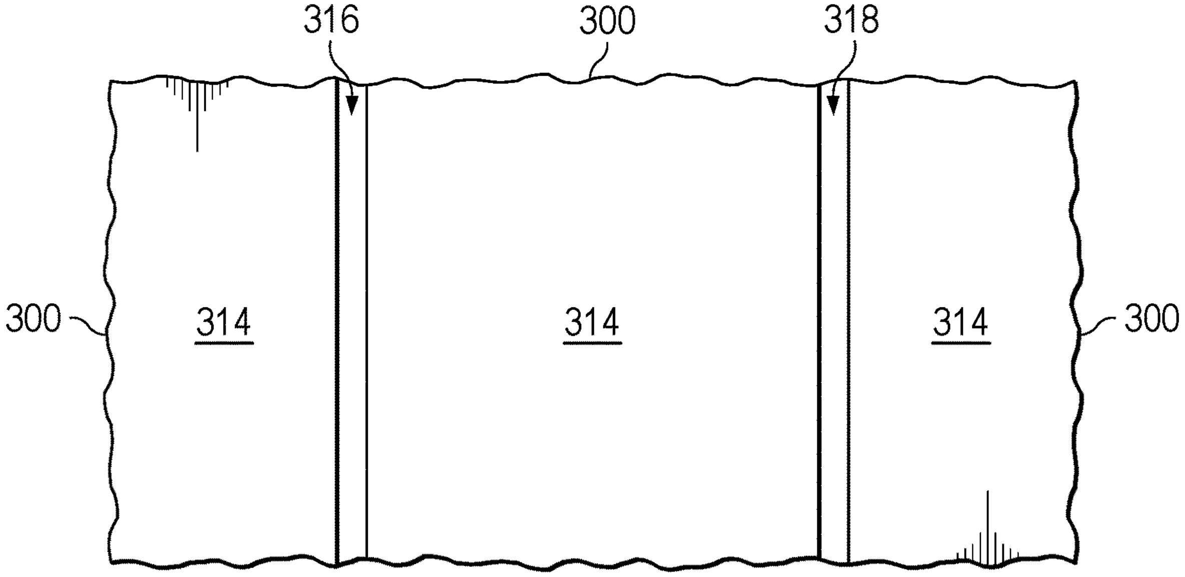
FIG. 3C2

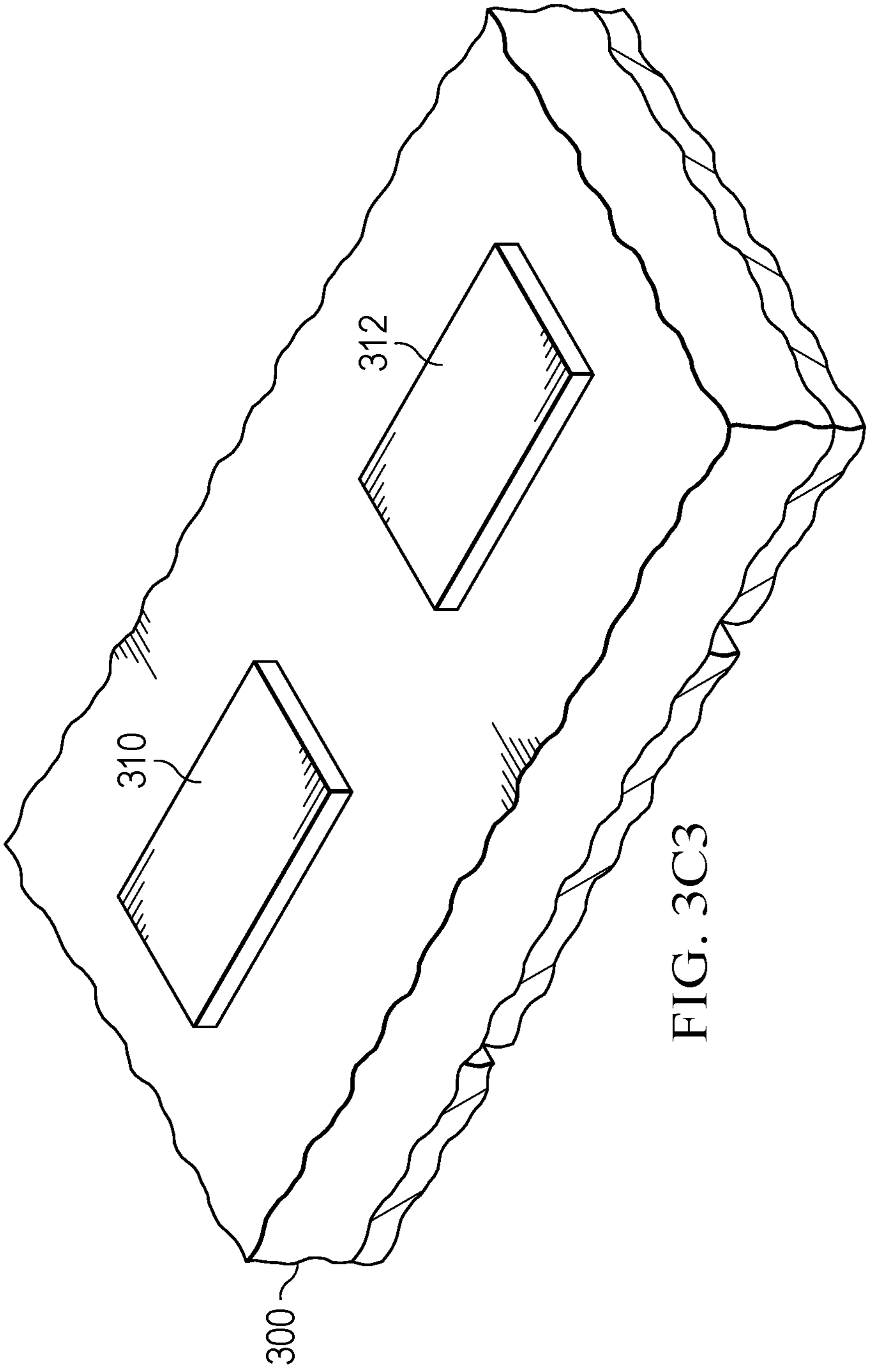
FIG. 3C3

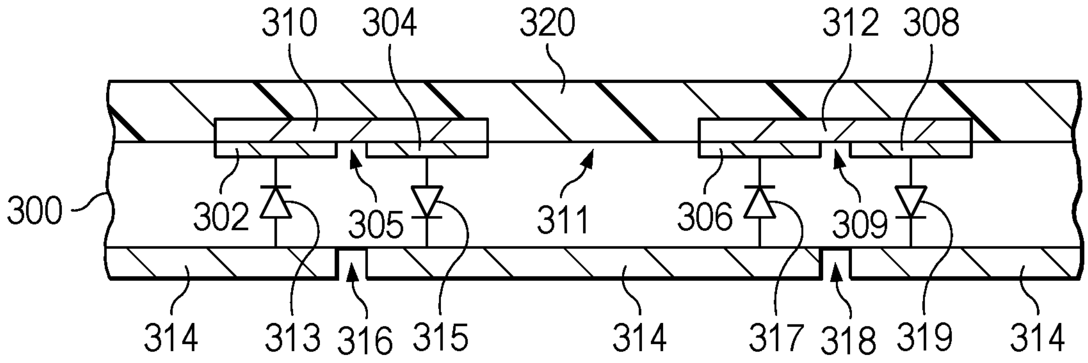
FIG. 3D1
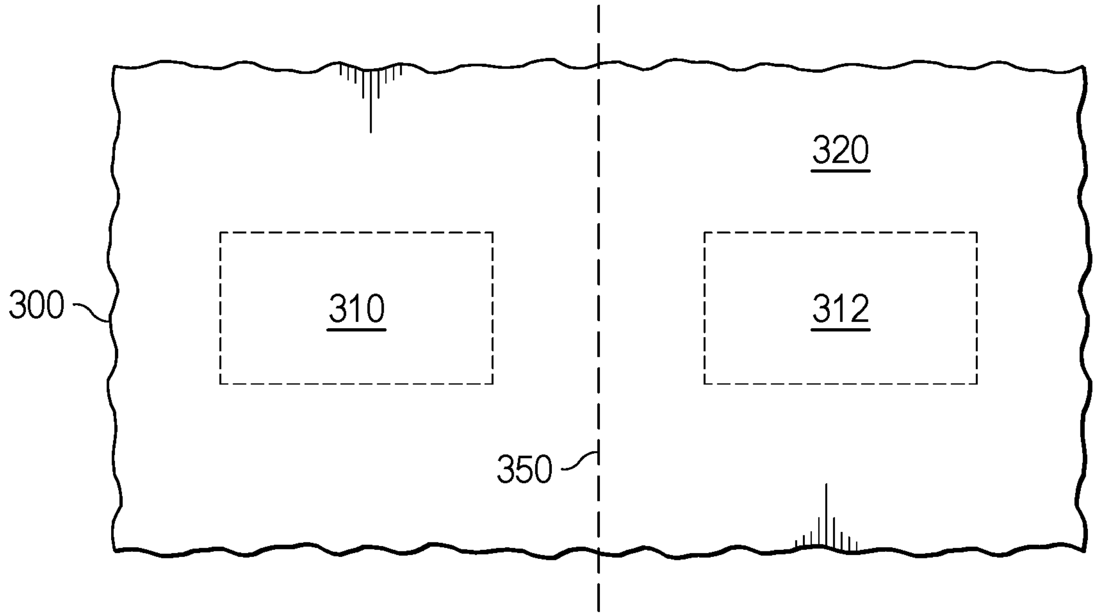
FIG. 3D2

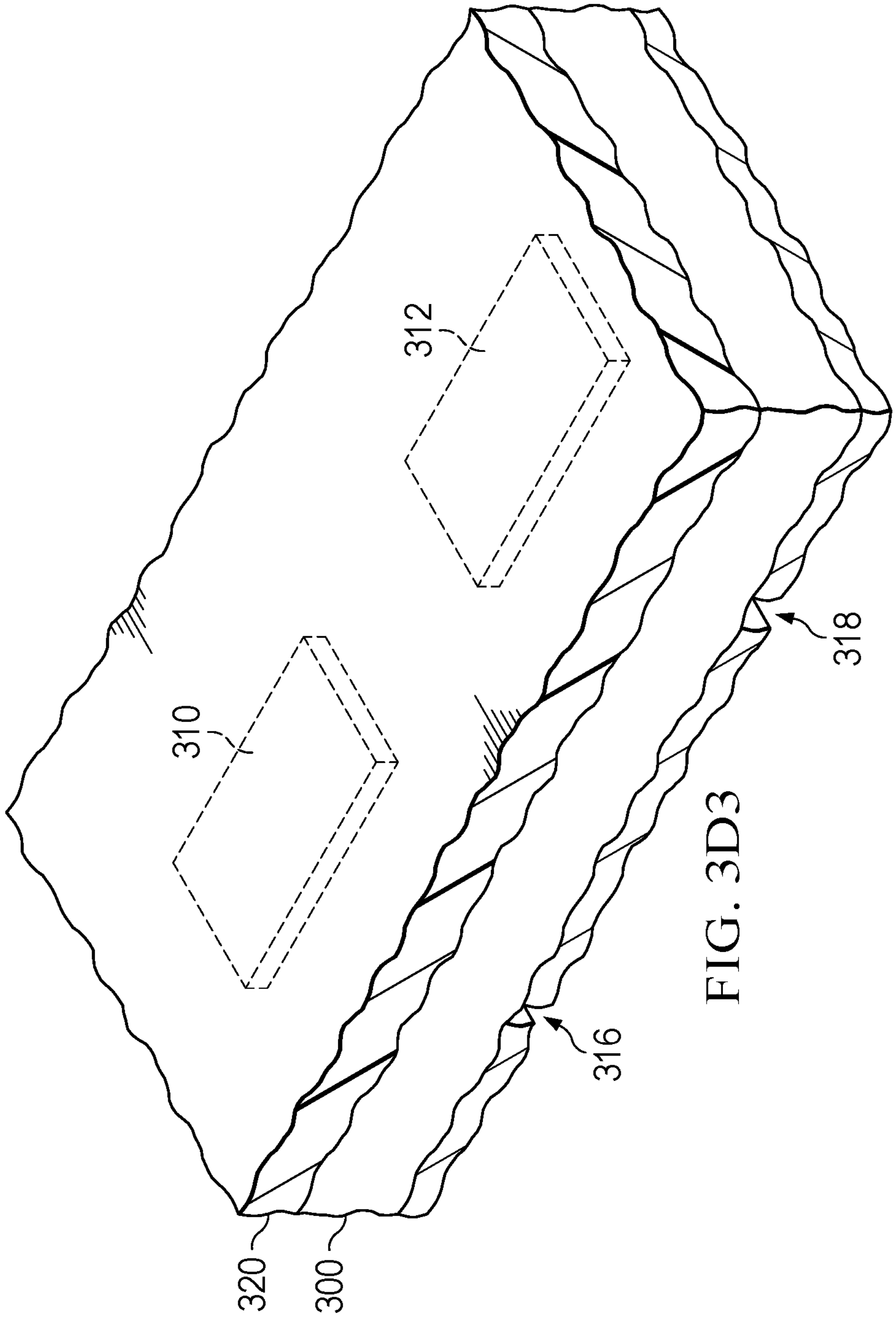
FIG. 3D3

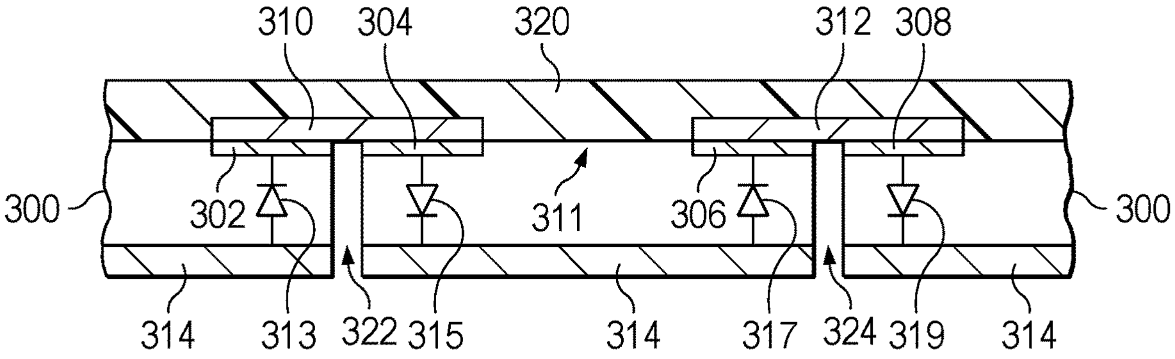
FIG. 3E1
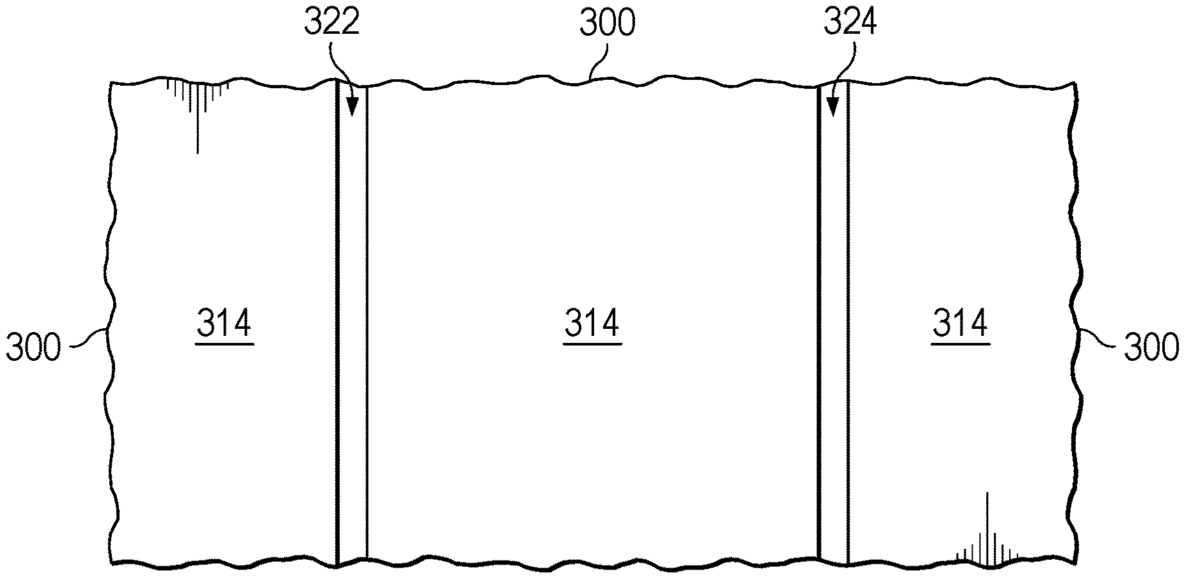
FIG. 3E2

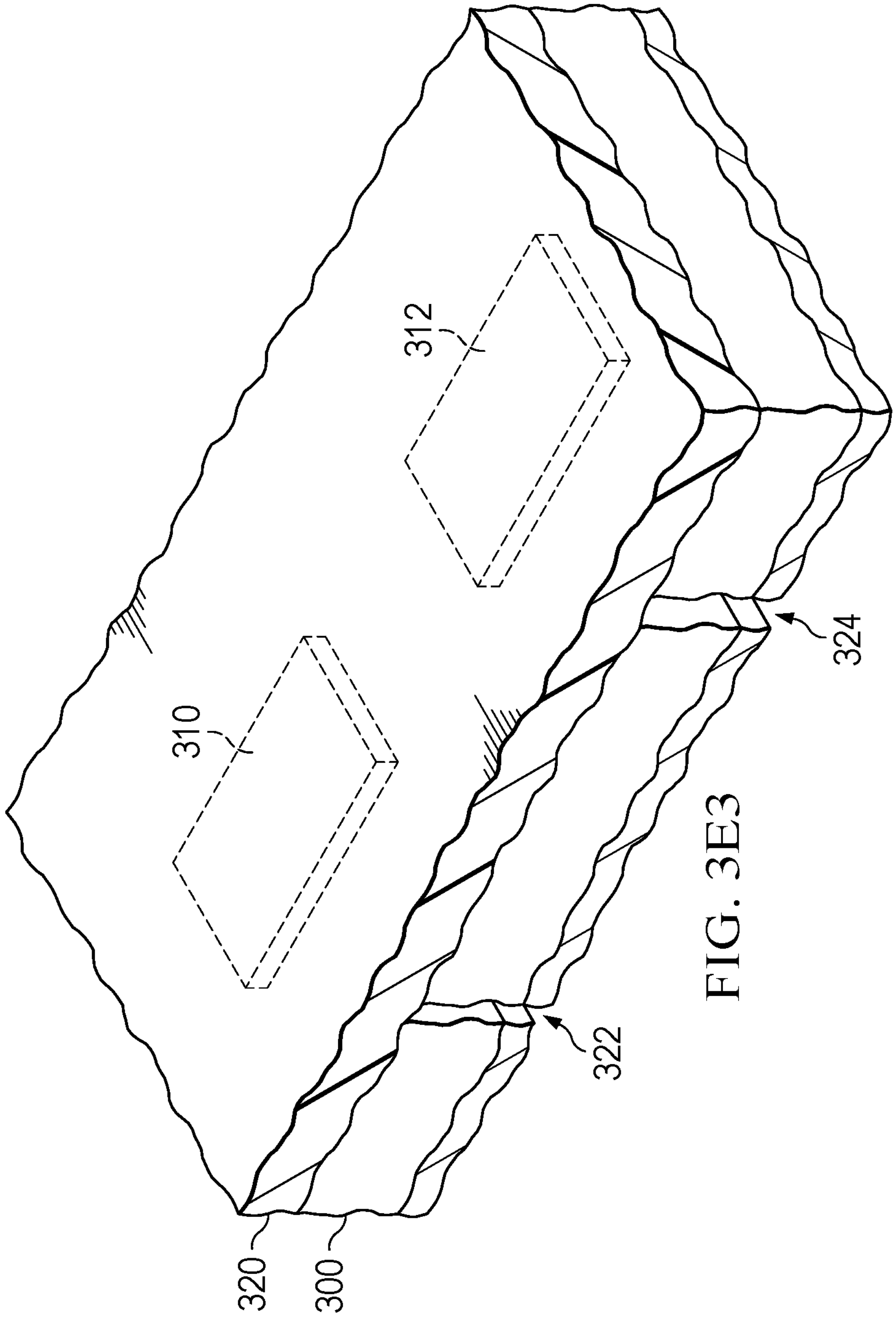
FIG. 3E3

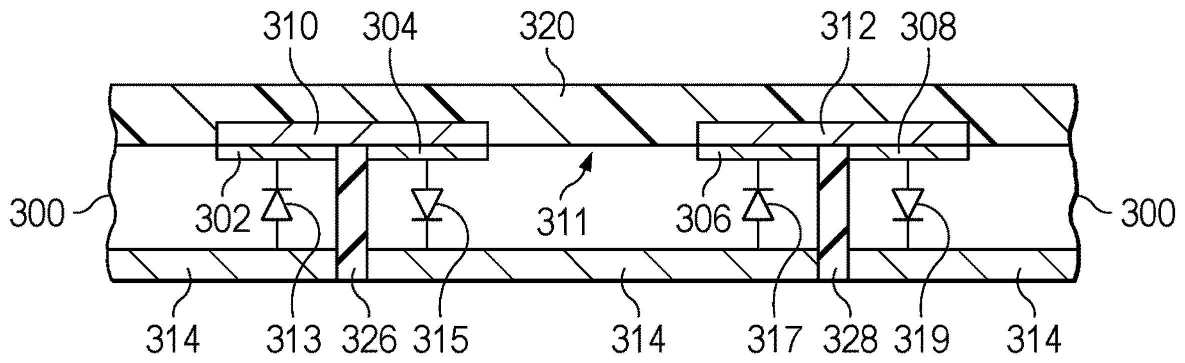
FIG. 3F1
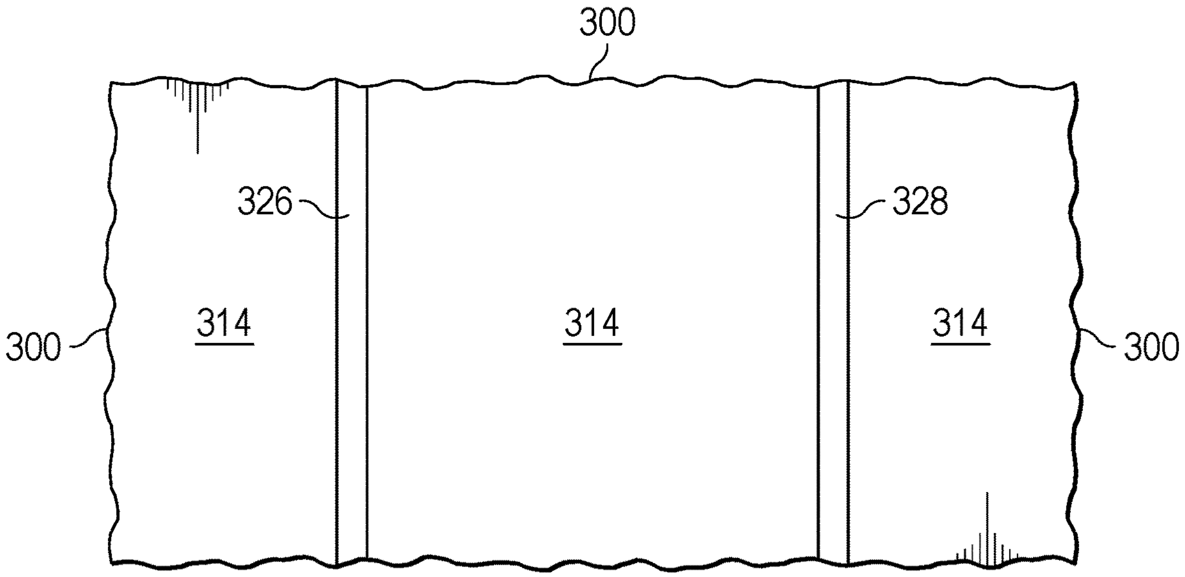
FIG. 3F2

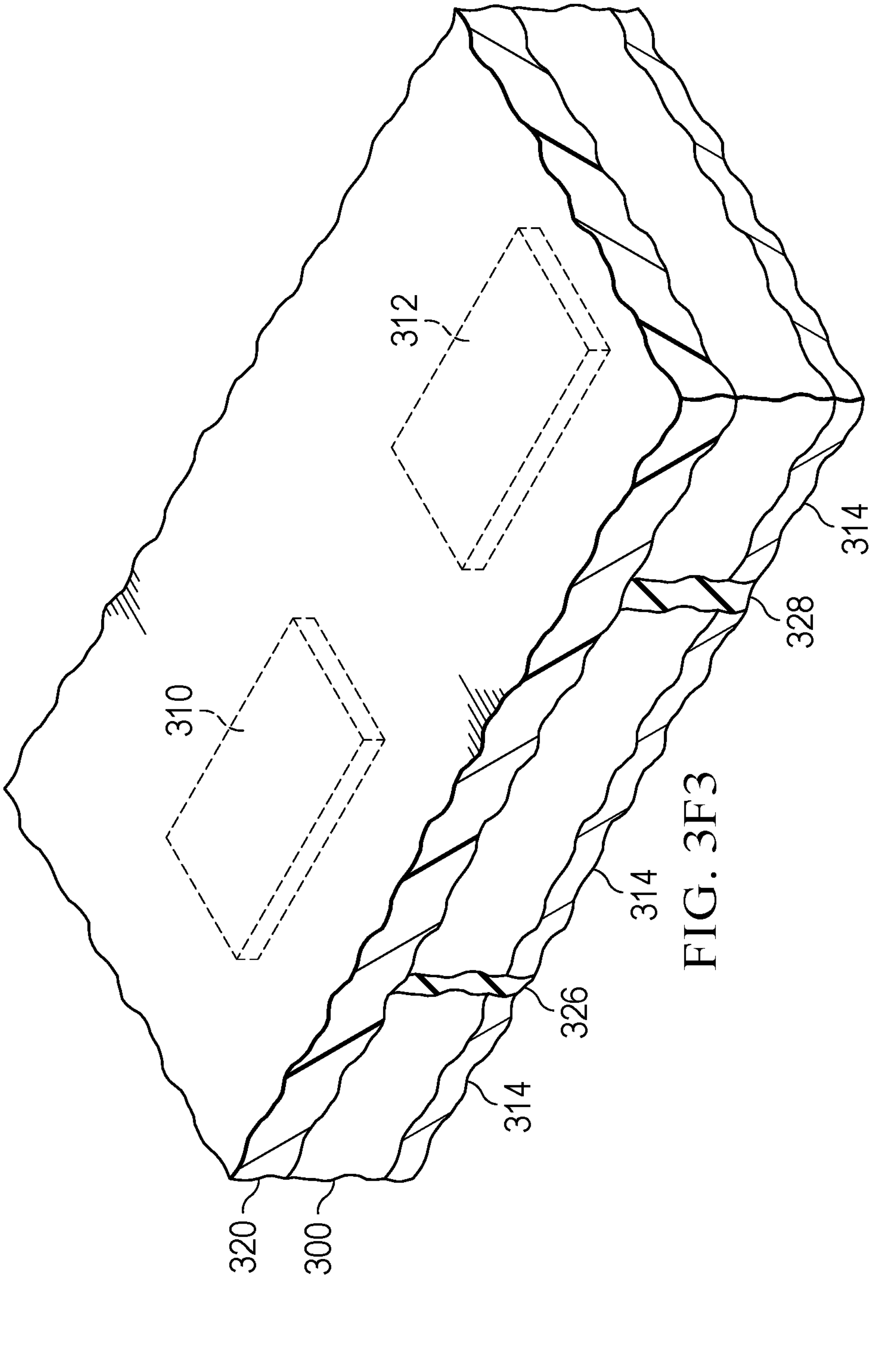
FIG. 3F3

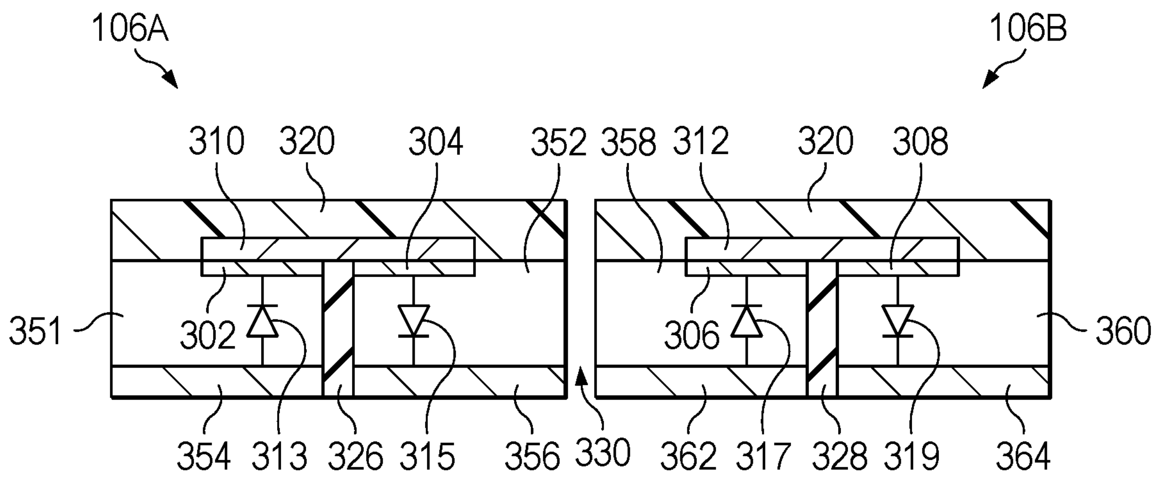
FIG. 3G1
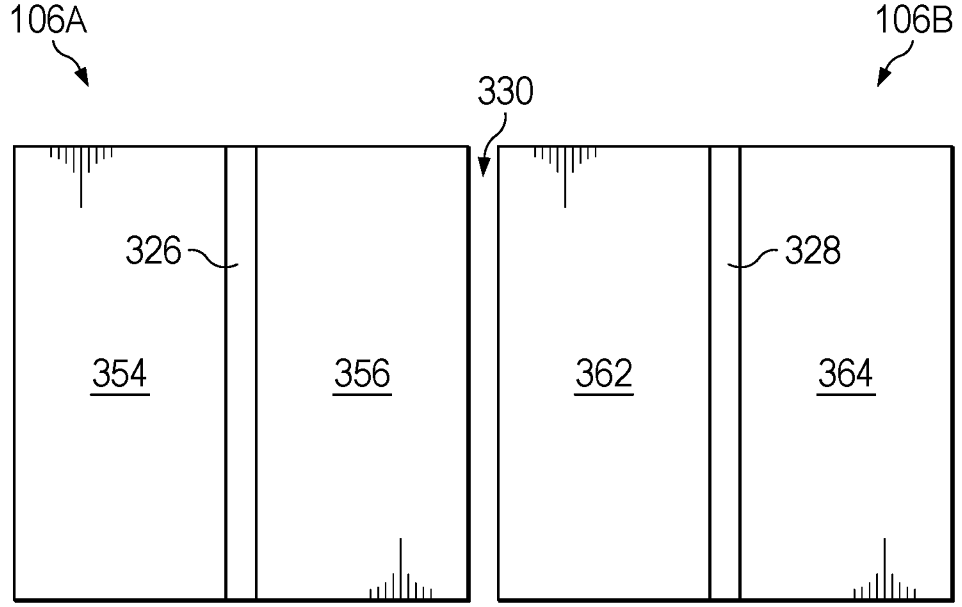
FIG. 3G2

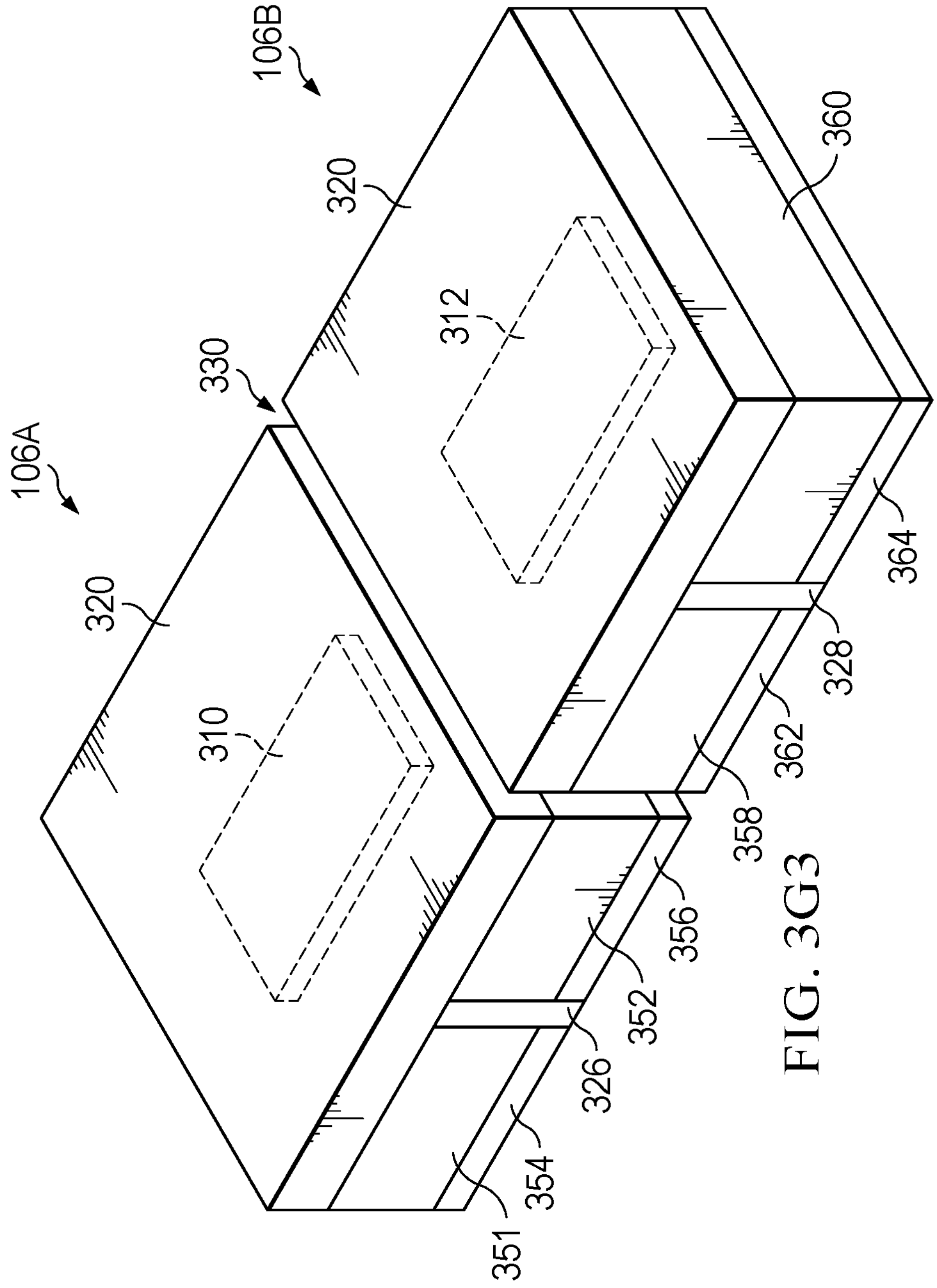
FIG. 3G3

WAFER-LEVEL FABRICATION OF ELECTROSTATIC DISCHARGE DEVICES

BACKGROUND

Semiconductor wafers are circular pieces of semiconductor material, such as silicon, that are used to manufacture semiconductor chips. Generally, complex manufacturing processes are used to form numerous integrated circuits on a single wafer. The formation of such circuits on a wafer is called fabrication. After wafer fabrication, the wafer is cut into multiple pieces, called semiconductor dies, with each die containing one of the circuits. The cutting, or sawing, of the wafer into individual dies is called singulation.

SUMMARY

In examples, a package comprises first and second dies including first and second diodes, respectively. The package comprises first and second metal contacts coupled to bottom surfaces of the first and second dies, respectively, with the first and second metal contacts exposed to a bottom surface of the package. The package also comprises an isolation layer between the first and second dies and between the first and second metal contacts and a metal layer coupled to top surfaces of the first and second dies. The package also comprises a mold compound covering the first and second dies and the metal layer.

In examples, a method for manufacturing a package comprises forming a metal layer on a first surface of a semiconductor wafer. The wafer includes first and second diodes and first and second metal contacts coupled to the first and second diodes. The first and second metal contacts are separated by a first gap. The metal layer is formed on the first and second metal contacts. The method also comprises forming third and fourth metal contacts on a second surface of the wafer opposite the first surface of the wafer, with a second gap between the third and fourth metal contacts in vertical alignment with the first gap. The method comprises covering the metal layer and the wafer with a mold compound. The method also comprises forming a trench in the wafer through the first and second gaps, filling the trench with an isolation material, and singulating the wafer to produce a package.

BRIEF DESCRIPTION OF THE DRAWINGS

FIGS. 3A1-3G3 are a process flow of a method for manufacturing an electrostatic discharge device, in accordance with various examples.

DETAILED DESCRIPTION

Various electronic devices, such as laptop and desktop computers, consumer electronics such as televisions, appliances, etc., are subject to occasional overvoltage conditions that represent a threat to the functional integrity of the devices. Overvoltage conditions, such as may be associated with a power surge, can damage electronic devices and render them unusable. For example, a dangerously high voltage may be provided to a pin within a universal serial bus (USB) port, potentially damaging the electronic device containing the port and/or any other devices that may be coupled to the port.

Some devices are useful to mitigate the risks that accompany overvoltage conditions. Generally, such devices contain diodes that are connected to each other using bond wires. Consequently, the devices are undesirably large and expensive. Efforts to reduce device size and cost result in diminished performance.

This disclosure describes various examples of an electrostatic discharge device (ESD) that mitigates the challenges described above. Specifically, the ESD is manufactured in such a way that it reduces size and cost typically associated with such devices without diminishing performance. In examples, an ESD package comprises first and second dies including first and second diodes, respectively. The package also includes first and second metal contacts coupled to bottom surfaces of the first and second dies, respectively, with the first and second metal contacts exposed to a bottom surface of the package. The package also comprises an isolation layer between the first and second dies and between the first and second metal contacts, as well as a metal layer coupled to top surfaces of the first and second dies. The package includes a mold compound covering the first and second dies and the metal layer.

Figure 1:
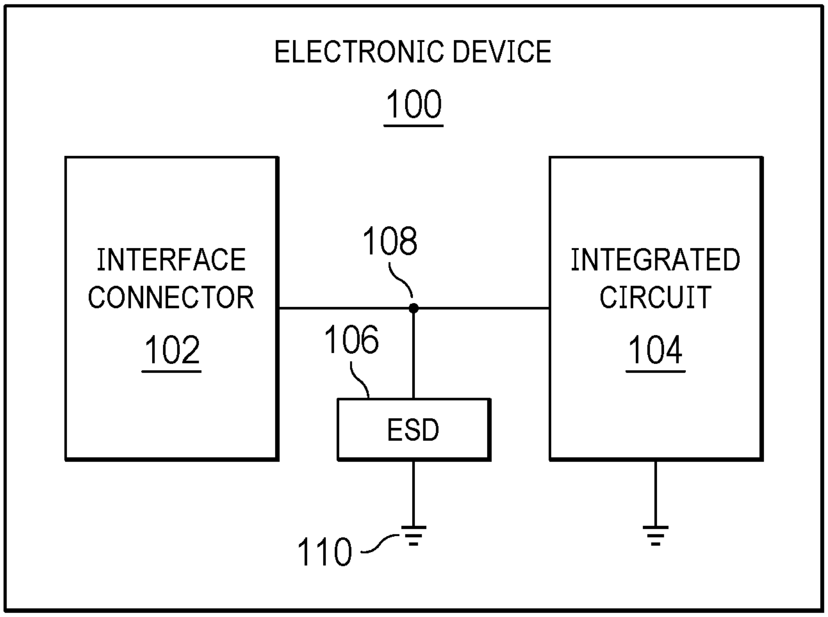
FIG. 1 is a block diagram of an electronic device including an electrostatic discharge device, in accordance with various examples.

FIG. 1 is a block diagram of an electronic device 100 including an electrostatic discharge device (ESD), in accordance with various examples. The electronic device 100 may be any suitable type of device, such as a computer (e.g., a laptop computer, a desktop computer, a notebook computer), a consumer electronic device (e.g., a television, a stereo system), an appliance, a vehicle, an aircraft, a spacecraft, etc. The electronic device 100 includes an interface connector 102, such as a universal serial bus (USB) port, a high-definition multimedia interface (HDMI) port, etc. Other types of ports and connectors are contemplated and included in the scope of this disclosure. An integrated circuit (IC) 104 is coupled to the connector 102. For example, the IC 104 may include circuitry configured to perform one or more functions to enable or facilitate the operations of the electronic device 100. The connector 102 may couple to another device external to the electronic device 100, with a cable (e.g., USB or HDMI cable) facilitating communications between that external device and the IC 104, as well as with other circuitry and/or devices that may be coupled to the connector 102.

The electronic device 100 may include an ESD 106 coupled to the connector 102 and the IC 104. The connector 102, IC 104, and ESD 106 may be coupled to a common printed circuit board (PCB), in some examples. In other examples, one or more of the connector 102, IC 104, and ESD 106 may be coupled to different PCBs. The IC 104 may be coupled to specific pin(s) of the connector 102, and the ESD 106 may be coupled to at least those pin(s) to which the IC 104 is coupled. The ESD 106 is configured to protect the IC 104 from the consequences of overvoltage conditions. Specifically, when an overvoltage condition occurs, the voltage provided from the connector 102 to the IC 104 on node 108 may be beyond the voltage threshold that the IC 104 can safely tolerate. The ESD 106 is configured to close a circuit to ground 110 when the voltage on node 108 begins to approach this dangerous voltage threshold, but before the voltage threshold is actually reached. In this way, the voltage on node 108 is pulled to ground or close to ground, thus mitigating risk to the IC 104.

As described above, ESDs are manufactured using a process that entails wirebonding multiple diodes together.

As also described above, the resulting ESD consumes an unacceptable amount of space and has high manufacturing costs. Techniques to reduce the ESD size and cost result in diminished performance. The ESD 106 manufacturing process described below with reference to FIGS. 2 and 3A1-3G3 is less expensive than the manufacturing process that uses wire bonds for electrical connection and produces smaller ESDs without diminished performance. FIGS. 3A1-3G3 also depict structural details of the ESD 106.

Figure 2:
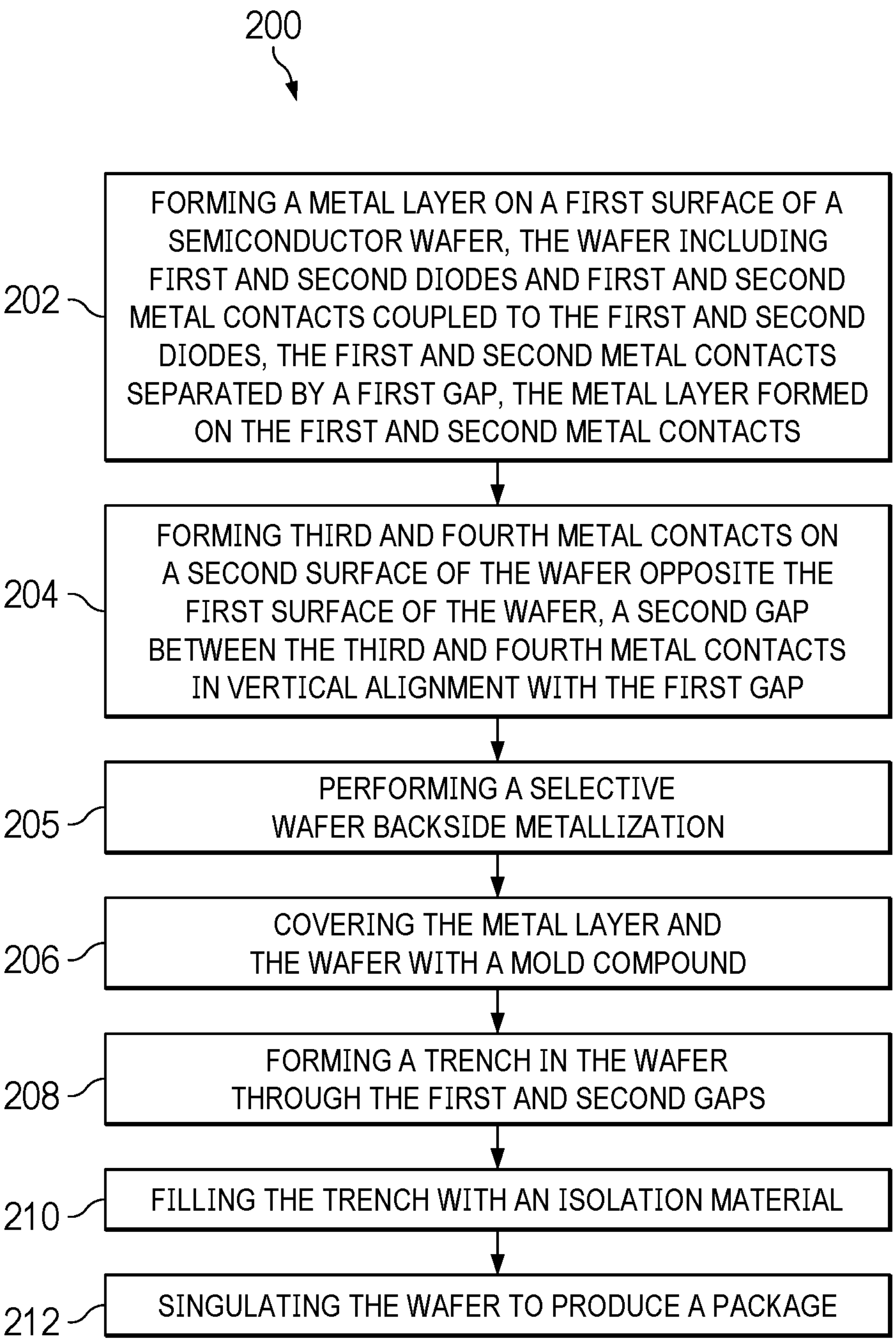
FIG. 2 is a flow diagram of a method for manufacturing an electrostatic discharge device, in accordance with various examples.

FIG. 2 is a flow diagram of a method 200 for manufacturing an ESD (e.g., ESD 106), in accordance with various examples. FIGS. 3A1-3G3 are a process flow of a method for manufacturing an ESD (e.g., ESD 106), in accordance with various examples. Accordingly, FIGS. 2 and 3A1-3G3 are now described in parallel.

The method 200 begins with forming a metal layer on a first surface of a semiconductor wafer (202). The wafer includes first and second diodes and first and second metal contacts coupled to the first and second diodes (202). The first and second metal contacts are separated by a first gap (202). The metal layer is formed on the first and second metal contacts (202). FIG. 3A1 depicts a cross-sectional view of a wafer 300. Diodes 313, 315, 317, and 319 are formed within the wafer 300 and are coupled to metal contacts 302, 304, 306, and 308 (e.g., plated or deposited by metal evaporation deposition), respectively. The diodes are represented with diode symbols to better illustrate anode and cathode terminal orientations. The scope of this disclosure is not limited to any particular type of diode. A gap 305 separates the metal contacts 302 and 304. A gap 309 separates the metal contacts 306 and 308. A gap 311 separates the metal contacts 304 and 306. In examples, each of the diodes 313, 315, 317, and 319 has a threshold voltage (i.e., the voltage at which the diode closes circuit and allows current to pass through) that is a fraction of the total threshold voltage of the ESD 106. For example, the structure shown in FIG. 3A1 will later be singulated (e.g., sawn) vertically at gap 311 to form two separate ESDs 106, as described below. Thus, diodes 313 and 315 will be part of one ESD 106, and diodes 317 and 319 will be part of a different ESD 106. The threshold voltages of diodes 313 and 315 should combine to equal the desired threshold voltage for the ESD 106 in which they are included. Similarly, the threshold voltages of diodes 317 and 319 should combine to equal the desired threshold voltage for the ESD 106 in which they are included. For example, the diodes 313 and 315 may each have threshold voltages of 1.6 V for a total combined threshold voltage of the respective ESD 106 of 3.2 V. The diode 313 must be oriented (i.e., formed in the wafer 300) such that the cathode of the diode 313 is more proximal to the metal contact 302 and the anode of the diode 313 is more distal to the metal contact 302. The diode 315 must be oriented such that the anode of the diode 315 is more proximal to the metal contact 304 and the cathode of the diode 315 is more distal to the metal contact 304. The diode 317 must be oriented (i.e., formed in the wafer 300) such that the cathode of the diode 317 is more proximal to the metal contact 306 and the anode of the diode 317 is more distal to the metal contact 306. The diode 319 must be oriented such that the anode of the diode 319 is more proximal to the metal contact 308 and the cathode of the diode 319 is more distal to the metal contact 308. FIG. 3A2 is a top-down view of the structure of FIG. 3A1 in accordance with some examples, and FIG. 3A2 depicts a wafer saw street 350. FIG. 3A3 is a perspective view of the structure of FIG. 3A1 in accordance with some examples.

The method 200 includes forming third and fourth metal contacts on a second surface of the wafer opposite the first surface of the wafer (204). A second gap is present between the third and fourth metal contacts in vertical alignment with the first gap (204). FIG. 3B1 shows a cross-sectional view of a metal layer 310 coupled to the metal contacts 302 and 304, and a metal layer 312 coupled to the metal contacts 306 and 308. The metal layers 310 and 312 may be deposited by plating or by metal evaporation deposition, as may be appropriate. Each of the metal layers 310, 312 has a rectangular prism shape. Each of the metal layers 310, 312 has flat top, bottom, and lateral surfaces. Each of the metal layers 310 and 312 has a thickness ranging from 1 micron to 100 microns, with a thickness below this range being disadvantageous because it introduces high resistance and low current carrying capability, and with a thickness above this range being disadvantageous because of manufacturing challenges and cost inefficiencies. The metal layer 310 provides an electrical pathway between the metal contacts 302 and 304, and the metal layer 312 provides an electrical pathway between the metal contacts 306 and 308. A gap 321 separates the metal layers 310 and 312. FIG. 3B2 is a top-down view of the structure of FIG. 3B1, in accordance with various examples. FIG. 3B3 is a perspective view of the structure of FIG. 3B1, in accordance with various examples.

The method 200 includes performing a selective wafer backside metallization (205). FIG. 3C1 is a cross-sectional view showing a metal layer 314 on the backside of the wafer 300. The metal layer 314 is segmented by a gap 316 that is vertically aligned with the gap 305, and by a gap 318 that is vertically aligned with the gap 309. The selective wafer backside metallization to apply the metal layer 314 to the backside of the wafer 300 may be performed using any suitable technique, for example, chemical vapor deposition (CVD) using an appropriately patterned mask to form the gaps 316 and 318. Critical properties of the metal layer 314 and the gaps 316, 318 are described below. FIG. 3C2 is a bottom-up view of the structure of FIG. 3C1, in accordance with various examples. FIG. 3C3 is a perspective view of the structure of FIG. 3C1, in accordance with various examples.

The method 200 includes covering the metal layer and the wafer with a mold compound (206). FIG. 3D1 is a cross-sectional view depicting the application of a mold compound layer 320 to the wafer 300 and the metal layers 310, 312, as shown. Any suitable application technique, such as wafer compression molding, may be useful to apply the mold compound layer 320. The thickness of the mold compound layer 320 from the top of the mold compound layer 320 to the top surface of the metal layers 310, 312 ranges from 50 microns to 800 microns, with a thickness lower than this range being disadvantageous because of an unacceptably increased risk of exposing the die surface, and with a thickness greater than this range being disadvantageous because it exceeds package thickness specifications. FIG. 3D2 is a top-down view of the structure of FIG. 3D1, in accordance with various examples. FIG. 3D3 is a perspective view of the structure of FIG. 3D1, in accordance with various examples.

The method 200 includes forming a trench in the wafer through the first and second gaps (208). FIG. 3E1 is a cross-sectional view depicting the formation of trench 322 in the wafer 300 through the gaps 316 and 305, and further depicting the formation of trench 324 in the wafer 300 through the gaps 318 and 309. Any suitable technique, such as plasma etching, may be useful to form the trenches 322, 324. The trench 322 extends from the metal layer 310, through the gap 305, through the wafer 300, and through the gap 316. The trench 324 extends from the metal layer 312, through the gap 309, through the wafer 300, and through the gap 318. The width of each of the trenches 322, 324 is similar to the width of the corresponding gap 316, 318. FIG. 3E2 is a bottom-up view of the structure of FIG. 3E1, in accordance with various examples. FIG. 3E3 is a perspective view of the structure of FIG. 3E1, in accordance with various examples.

The method 200 includes filling the trench with an isolation material (210). Any suitable isolation material, such as parylene or resin, may be useful as an isolation material, and any suitable application technique, such as CVD or printing techniques, may be useful to fill the trench with the isolation material. FIG. 3F1 is a cross-sectional view depicting the filling of the trench 322 with isolation material 326, and filling of the trench 324 with isolation material 328. The isolation material 326 contacts the metal layer 310, the metal contacts 302, 304, the wafer 300, and the metal layer 314. The isolation material 328 contacts the metal layer 312, the metal contacts 306, 308, the wafer 300, and the metal layer 314. FIG. 3F2 is a bottom-up view of the structure of FIG. 3F1, in accordance with various examples. FIG. 3F3 is a perspective view of the structure of FIG. 3F1, in accordance with various examples.

The method 200 includes singulating the wafer to produce a package (212). FIG. 3G1 is a cross-sectional view depicting the singulation of the structure of FIG. 3F1 between the metal layers 310 and 312. Any suitable singulation technique may be useful, including mechanical and laser sawing. Singulation produces gap 330, resulting in two separate ESDs (e.g., packages) 106A, 106B. FIG. 3G2 is a bottom-up view of the structure of FIG. 3G1, in accordance with various examples. FIG. 3G3 is a perspective view of the structure of FIG. 3G1, in accordance with various examples. As shown in FIGS. 3G1-3G3, the isolation material 326 includes a surface exposed to an exterior of the package 106A (as is the case for isolation material 328 and package 106B). The isolation material 326 contacts side surfaces of the dies 351, 352, and of the metal contacts 354, 356, and a portion of the metal layer 310. Similarly, the isolation material 328 contacts side surfaces of the dies 358, 360, and of the metal contacts 362, 364, and a portion of the metal layer 312.

The ESD 106A includes semiconductor dies 351, 352. The ESD 106A also includes metal contacts 354, 356 coupled to the dies 351, 352, respectively. Referring to FIGS. 1 and 3G1, the metal contact 354 may be coupled to node 108, and the metal contact 356 may be coupled to ground 110. When the node 108 is nearing an overvoltage condition, the voltage on node 108 will be sufficiently high to turn on both of the diodes 313, 315, thereby establishing an electrical pathway between contacts 354, 356, and thus an electrical pathway between node 108 and ground 110. Thus, node 108 is pulled down to approximately 0 V (e.g., ground), and the IC 104 (and possibly other devices) is protected from the consequences of overvoltage conditions. The metal contacts 354, 356 are rectangular prisms and have flat top, bottom, and lateral surfaces, in some examples.

Similarly, the ESD 106B includes semiconductor dies 358, 360 and includes metal contacts 362, 364 coupled to the dies 358, 360, respectively. Referring to FIGS. 1 and 3G1, the metal contact 362 may be coupled to node 108, and the metal contact 364 may be coupled to ground 110. When the node 108 is nearing an overvoltage condition, the voltage on node 108 will be sufficiently high to turn on both of the diodes 317, 319, thereby establishing an electrical pathway between contacts 362, 364, and thus an electrical pathway between node 108 and ground 110. Thus, node 108 is pulled down to approximately 0 V (e.g., ground), and the IC 104 (and possibly other devices) is protected from the consequences of overvoltage conditions. The metal contacts 362, 364 are rectangular prisms and have flat top, bottom, and lateral surfaces, in some examples.

The metal contacts 354, 356, 362, and 364 have specific physical properties that are critical to mitigating parasitic capacitance in the respective ESDs 106A, 106B. Electrical simulation data indicates the following capacitances (in femtoFarads (fF)) may be realized between the metal contacts 354, 356 (and, similarly, between metal contacts 362, 364), depending on the thicknesses of these metal contacts and the spacing between these metal contacts:

| Contact Spacing | Contact Thickness (microns) | | |
|---|---|---|---|
| (microns) | 1 | 10 | 50 |
| 10 | 14.4 fF | 18.7 fF | 37.6 fF |
| 30 | 11.1 fF | 11.9 fF | 19.6 fF |
| 80 | 7.6 fF | 8.7 fF | 11.9 fF |

Some ESDs as described above will have a baseline inter-contact capacitance of approximately 40.3 fF. In contrast, as the simulation data in the table above indicates, the thicknesses of the metal contacts 354, 356 (and similarly, metal contacts 362, 364) may be reduced, and the spacing between the metal contacts 354, 356 (and between metal contacts 362, 364) increased, to mitigate capacitance between the contacts. A lower capacitance between the metal contacts 354, 356 (and between metal contacts 362, 364) is beneficial because the ESD 106 is attached to high speed signal lines used in the interface connector 102 (e.g., HDMI and USB3.0/USB-C). The lower the parasitic capacitance of the ESD 106, the less noise is added to the data line, which helps the system keep a clear signal from port to port when transferring data at high speed. Higher and higher signal transfer speeds require lower and lower parasitic capacitance to keep the signal clear and readable by the chips (e.g., IC 104) reading the data being transferred. The balance of thickness of the metal contacts 354, 356 (and contacts 362, 364) and spacing between the metal contacts 354, 356 (and between contacts 362, 364) is optimized at 10 microns and 30 microns, respectively, for a capacitance of 11.9 fF, which is a substantial reduction in capacitance while achieving substantial reductions in ESD size by keeping inter-contact spacing below the spacing of 50 microns. More specifically, due to the method of manufacture 200, the spacing between the metal contacts 354, 356 (and similarly, between metal contacts 362, 364) can be significantly reduced relative to some technologies to reduce the space occupied by the ESD 106A (and ESD 106B). Some technologies use lead frames with a minimal spacing of 50 microns, while in contrast, the spacing between the metal contacts 354, 356 (and between metal contacts 362, 364) ranges from 5 microns to 10 microns in some examples. This reduced spacing is possible because of the method of manufacture 200, such as by the formation of trenches and the use of plating and/or metal evaporation deposition techniques, which are not used to manufacture some ESDs, where such small spacing is not possible.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A package, comprising:
- first and second dies including first and second diodes, respectively;
- first and second metal contacts coupled to bottom surfaces of the first and second dies, respectively, the first and second metal contacts visible from a bottom view of the package;
- an isolation layer between the first and second dies and between the first and second metal contacts;
- a metal layer coupled to top surfaces of the first and second dies; and
- a mold compound covering the first and second dies and the metal layer.

2. The package of claim 1, further comprising third and fourth metal contacts exposed to the top surfaces of the first and second dies, wherein the third and fourth metal contacts are positioned under the metal layer.

3. The package of claim 1, wherein the isolation layer comprises parylene or resin.

4. The package of claim 1, wherein a distance between the first and second metal contacts ranges between 5 microns and 10 microns.

5. The package of claim 1, wherein:
- the isolation layer includes a surface visible from the bottom view of the package; and
- the isolation layer contacts side surfaces of the first and second dies, and the first and second metal contacts, and a portion of the metal layer.

6. The package of claim 1, wherein the metal layer is a rectangular prism.

7. The package of claim 1, wherein the first and second metal contacts are rectangular prisms.

8. A package, comprising:
- first and second dies including first and second diodes, respectively;
- first and second metal contacts coupled to bottom surfaces of the first and second dies, respectively, the first and second metal contacts visible from a bottom view of the package;
- third and fourth metal contacts exposed to top surfaces of the first and second dies, respectively;
- isolation material between the first and second dies, between the first and second metal contacts, and between the third and fourth metal contacts;
- a metal layer coupled to the top surfaces of the first and second dies; and
- a mold compound covering the first and second dies and the metal layer,
- wherein the first and second metal contacts are spaced between 5 microns and 10 microns apart.

9. The package of claim 8, wherein the first and second metal contacts are rectangular prisms.

10. The package of claim 8, wherein the metal layer is a rectangular prism.

11. The package of claim 8, wherein the metal layer has a thickness ranging from 1 micron to 100 microns.

12. The package of claim 8, wherein the isolation material comprises parylene or resin.

13. A package comprising:
- a first die including a first metal contact and a second metal contact electrically connected to a first diode;
- a second die including a third metal contact and a fourth metal contact electrically connected to a second diode;
- an insulator between the first die and the second die;
- a metal layer electrically connected between the first diode and the second diode;
- a mold compound contacting portions of the first die, the second die, the metal layer, and the insulator, wherein the second metal contact and the fourth metal contact are visible from a bottom view of the package.

14. The package of claim 13, wherein a portion of the insulator is visible from the bottom view of the package.

15. The package of claim 13, wherein at least a side portion of each of the first die and the second die are visible from various side views of the package.

16. The package of claim 13, wherein the package is attached to a printed circuit board.

17. The package of claim 16, wherein the printed circuit board includes another integrated circuit.

18. The package of claim 16, wherein the printed circuit board includes an interface connector and an integrated circuit coupled to the package.

19. The package of claim 13, wherein the second metal contact and the fourth metal contact are connected to a ground voltage.

* * * * *